United States Patent [19]
Whang

[11] Patent Number: 4,810,921
[45] Date of Patent: Mar. 7, 1989

[54] ELASTIC SURFACE WAVE DEVICE

[75] Inventor: Keum C. Whang, Seoul, Rep. of Korea

[73] Assignee: Gold Star Instrument & Electric Co., Ltd., Seoul, Rep. of Korea

[21] Appl. No.: 150,497

[22] Filed: Feb. 1, 1988

Related U.S. Application Data

[63] Continuation of Ser. No. 732,638, May 10, 1985, abandoned.

[30] Foreign Application Priority Data

May 14, 1984 [KR] Rep. of Korea ............ 84-2599

[51] Int. Cl.$^4$ ............................................. H01L 41/08
[52] U.S. Cl. .................. 310/313 R; 310/313 B;
                                                310/313 D; 310/363
[58] Field of Search ........... 310/313 A, 313 B, 313 C,
               310/313 D, 363, 364; 333/150-155, 193-196

[56] References Cited

U.S. PATENT DOCUMENTS

| | | | |
|---|---|---|---|
| 3,975,698 | 8/1976 | Redman | 310/313 A X |
| 4,417,221 | 11/1983 | Hunsinger | 310/313 D X |
| 4,428,062 | 1/1984 | Michaels | 310/313 D X |
| 4,448,805 | 5/1984 | Lewis | 333/153 X |

Primary Examiner—Mark O. Budd
Attorney, Agent, or Firm—Cushman, Darby & Cushman

[57] ABSTRACT

The elastic surface wave device is comprised of an inter-digital transducer, a multi-strip coupler or a hone type acoustic beam width compresser, and an output terminal which are formed on a piezo electric substrate. The inter-digital transducer can produce an elastic surface wave signal which has a predetermined delay time, an electrode width equal to and u band width BW equal to $$2\frac{f_o}{N}.$$

The hone type acoustic beam width compresser can produce the mixed effect of non-linearity by transferring maximum energy in accordance with the proportion of the input acoustic beam width $l_1$ and the output acoustic beam width $l_2$ to increase the acoustic power density. The multi-strip coupler can filter low band frequencies by spatially integrating the electrical displacement of the elastic surface wave according to the electrode length of the output side.

2 Claims, 4 Drawing Sheets

ELASTIC SURFACE WAVE DEVICE

This is a continuation of application Ser. No. 732,638 filed May 10, 1985 which was abandoned.

BACKGROUND OF THE INVENTION

This invention relates to an elastic surface wave device, in particular to an elastic surface wave device comprising a multi-strip coupler or hone type acoustic beam width compresser combined with an interdigital transducer.

In conventional art, an elastic surface wave device is produced by depositing a thin metal film on a surface of piezo-electric substrate in which an interdigital transducer is designed. In the interdigital transducer, the electrodes are insulated from each other by being arranged in a comb type configuration as shown in FIG. 1, thereby forcing the electrical signal to proceed along the electric substrate surface, on which a thin metal film is deposited, when an electrical signal is applied to the input portion of the interdigital transducer. The signal velocity proceeding on the surface of the piezo-electric material moves slower by $$\frac{1}{100,000}$$

in comparison to that of the electro magnetic wave signal. Thus, with the above piezo electric device comprising a small configuration, the velocity of an F.M. signal can be delayed because the center frequency of such elastic surface wave device is determined by the width of the comb-type electrode.

Thus if the elastic surface wave device is used, it is not necessary to tune the center frequency as in the conventional R-L-C circuit.

Further, the size of the pizo-electric device is very small i.e. comparable to that of an intergrated circuit board and has a planar configuration. This highly reliable piezo-electric device is very easy and simple to produce by using the photolithography method.

Also, the center frequency and band pass width of the elastic surface wave is determined by the width and number of the comb type electrodes, therefore the elastic surface wave device can be operated at high frequency signals (10 MHz~500 MHz) or wide band signals (10 MHz~300 MHz).

On the other hand there are well-known techniques for discriminating the frequency modulating signal (F.M. Signal).

For example there are tuned F.M.discriminators provided with a differentiator and an amplitude detector, emitter coupled quadrature F.M. discriminators comprising a low-pass filter, and descriminators comprised of a voltage control oscillator, a phase comparator, and a low pass filter. But the subject F.M. discriminator has a complicated circuit configuration comprising a resistor, coil, capacitor, transistor and diode, and such an F.M. discriminator must be tuned to it's peripheral circuit, and thus is bulky and consumes a lot of power. Before, attempts have been made to produce an improved discriminator by using an integrated circuit, however, such a discriminator could not be used for discriminating frequencies above 30 MHz.

For overcoming the foregoing disadvantages an elastic surface wave device was developed for discriminating FM signals by using a piezo-electric element.

The device uses a non-linear silicon space charge, but has a problem in that it must use two silicon semiconductors formed in a step type dual configuration to retain a predetermined air gap (as disclosed by W. C. Wang in 1978).

Thus, there has always been a need to develop an elastic surface wave device which is simple in configuration, easy to produce, and capable of discriminating high frequencies and wide band signals.

Therefore to solve the aforementioned disadvantages and problems this invention comprises an elastic surface wave device which generates a frequency modulated signal by using a non-linear piezo-electric substrate. With this invention, tuning is unnecessary and its configuration is compact, consisting of a single chip. Further the device consumes little power and can be operated at high frequencies, for example 10 MHz~500 MHz and can deal with wide band signals, for example 10 MHz~300 MHz.

Thus, when the above device is installed and used in a conventional F.M. receiver (88 MHz~108 MHz), the operation transducing the intermediate frequency (I.F.) is not necessary.

Also such a device can be installed as an F.M. discriminator in the DPSK demodulator.

OBJECTS OF INVENTION

One object object of the present invention is to provide a improved elastic surface wave device using a non-linear piezo-electric material, the device comprised of a wide band inter-digital transducer having a center frequency of 93 MHz, an acoustic beam width compresser, and an output terminal all formed by depositing a thin film of aluminum over a non-linear piezo-electric substrate.

BRIEF DESCRIPTION OF DRAWINGS

This and other objects as well as advantages of the present invention will become clear by the following description of a preferred embodiment of the present invention with reference to the accompanying drawings, wherein.

DESCRIPTION OF THE PREFERRED EMBODIMENT OF THE INVENTION

Figure 1:
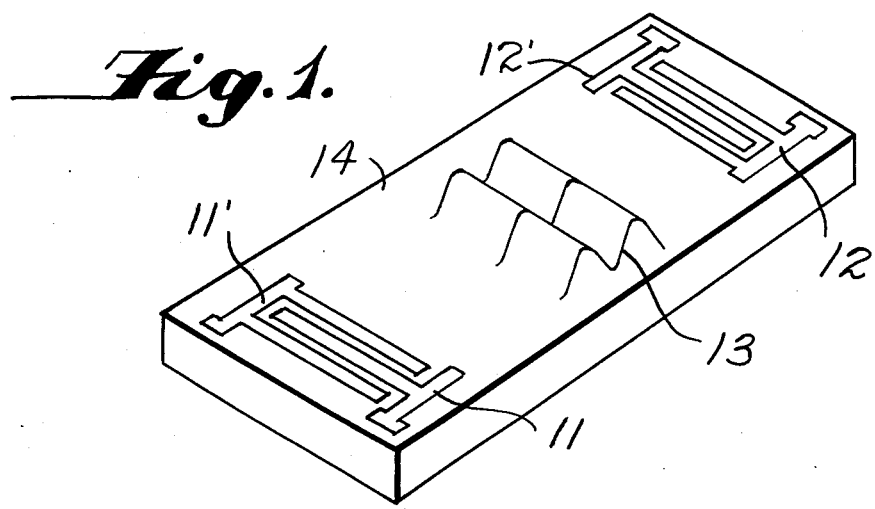
FIG. 1 is an illustration view showing a conventional elastic surface wave device.

Referring to FIG. 1, in the elastic surface wave device of the prior art, to discriminate the F.M. signal, the interdigital transducer 12, 11 on the positive electrode side of the piezoelectric substrate and the inter-digital transducer 11', 12' on the negative electrode side are interlaid in a comb type configuration, while the elastic surface wave 13 proceeding on the substrate is propagated with a delay time predetermined by the distance between said transducer electrodes.

Figure 2:
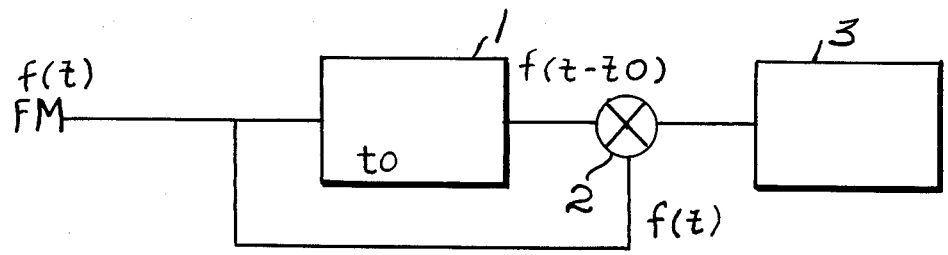
FIG. 2 is block diagram illustrating schmetically the principle for discriminating F.M. signals by using the elastic surface wave device in accordance with the present invention.
Figure 3:
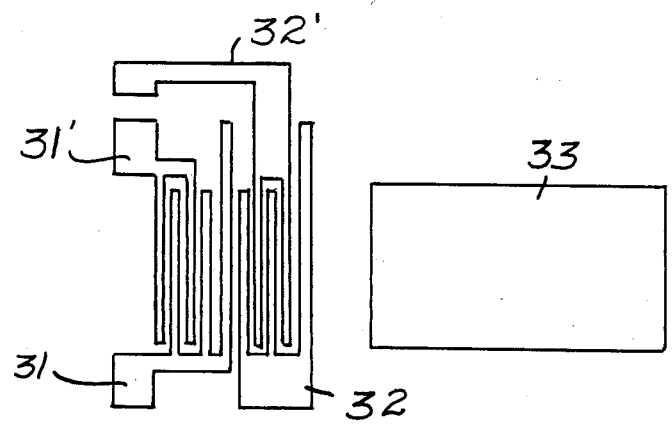
FIG. 3 is an illustration view showing the single F.M. signal discriminator realized by the elastic surface wave device in accordance with the present invention.

Substantially, an elastic surface wave device discriminates F.M. signals as shown in FIG. 2 in such a way that the F.M. signal is delayed by delay circuit 1 for a delay time of $t\phi$, and then is mixed by mixing circuit 2 which couples the electrical displacement of the delayed signal produced by the non-linearity of piezo-electric substrate with the original F.M. signal. Then the coupled signal is filtered by low band pass filter 3. Therefore the elastic surface wave device (hereafter referred to as the SAW discriminator) performs time delay, multiple operation and filtering all on a single chip of piezo-electric substrate on which a thin metal film is deposited as shown in FIG. 3. Time delay is obtained by inter-digital transducers 31, 32 and 31', 32' which produce individual elastic surface waves having delay time $t\phi$.

Figure 4:
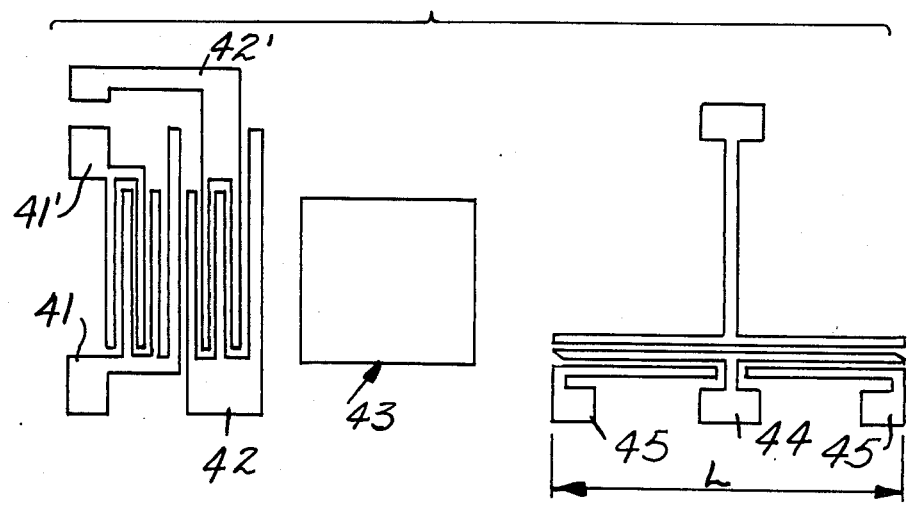
FIG. 4 is an illustration view showing a signal discriminator which comprises an acoustic beam width compresser of a multi-strip coupler in order to increase the slight piezo-electric non-linearity of the device shown in FIG. 3.
Figure 5:
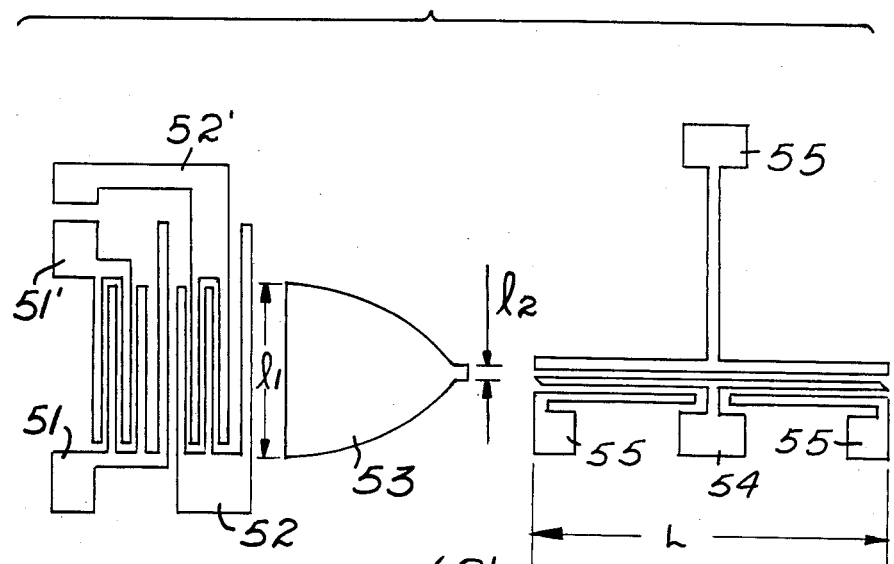
FIG. 5 is an illustration view showing an F.M. signal discriminator which comprises a hone type acoustic beam width compresser.
Figure 6:
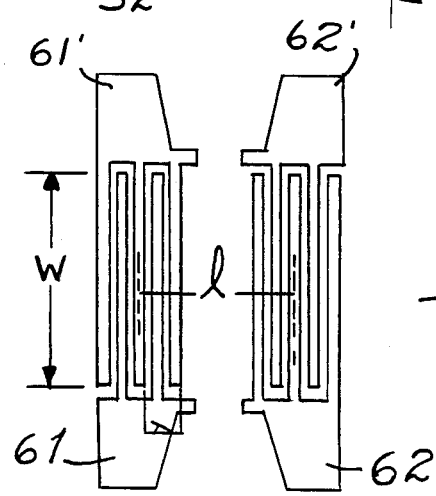
FIG. 6 is an illustration view showing the configuration of an interdigital transducer which has multiple comb type electrodes.

The two elastic surface wave transducers couple the electrical displacement and mechanical deformation of the elastic surface waves by means of the non-linearity of the piezo-electric substrate. But the non-linearity of the piezo-electric material is not sufficient to couple the electric fields of each elastic surface wave due to its limited capacity. Therefore as shown in FIG. 4 and FIG. 5 for solving these problems a multi-strip coupler 43 and an acoustic beam width compresser 53 are formed by depositing a thin metal film on the piezo electric substrate. Particularly a hone type acoustic beam width compresser 53 shown in FIG. 5 is designed to transfer maximum energy by compressing the acoustic power density in proportion to the input $l_1$ of acoustic beam width and output $l_2$ of acoustic beam width. Therefore, if an acoustic beam width compressor as illustrated in FIG. 4 and FIG. 5 is used, non-linearity of the piezo-electric substrate can be greatly increased by compressing the acoustic power density.

The elastic surface wave, which is electrically displaced and deformed by the increased non-linearity of the acoustic beam width compresser 53, is detected by the electrical displacement present at the output of thin metal terminals, 44, 54, wherein the electrical displacement of the elastic surface wave, varying in accordance with the length L of the output terminal carries out the spatial integration operation while the spatial integration operation itself performs low band pass filtering.

The output terminals 44, 45, 55 are the two terminal type whereby discriminated signals can be detected by the potential produced between the two output terminals by the electrical displacement.

An explanation relative to the operation principle of the SAW discriminator can be expressed by the below numerical Expressions;

The F.M. signal is represented as follows:

$$f(t) = A \cos\left(\omega_c t + \Delta\omega \int^t g(\tau)d\tau\right) = A \cos(\omega_c t + \beta \sin\omega_m t) \quad (1)$$

If the F.M. signal of expression (1) is applied to the two inter-digital transducers 41, 41', 42, 42' and 51, 51', 52, 52' having delay time $t_o$, the elastic surface waves, which have delay time $t_o$ and are propagated in the same direction, are derived from the transducers. The delayed F.M. signal is represented as follows:

$$f(t-z/v) \exp[j\omega(t-z/v)]$$

$$f(t-t\phi-z/v) \exp[j\omega(t-t_o-z/v)] \quad (2)$$

The two elastic surface waves of expression (2) are represented by the following expression in which the non-linearity of a piezo-electric material is increased in the acoustic beam width compresser 53 by the mixing effect.

$$\begin{aligned}
2f(t)f(t-t_o) &= 2AB\cos(\omega_c t + \beta\sin\omega_m t)\cos\{\omega_c(t-t_o) + \beta\sin\omega_m(t-t_o)\} \quad (3)\\
&= AB\cos\{\omega_c t_o + (2\beta\sin\tfrac{1}{2}\omega_m t_o)\cos(\omega_m t - \tfrac{1}{2}\omega_m t_o)\} + AB\cos\{2\omega_c t - \omega_c t_o + (2\beta\cos\tfrac{1}{2}\omega_m t_o)\sin(\omega_m t - \tfrac{1}{2}\omega_m t_o)\}
\end{aligned}$$

equations are as follows:

$$\cos(\alpha + \beta\sin\theta) = \sum_{n=-\infty}^{\infty} J_\eta(\beta)\cos(\alpha + \eta\theta) \quad (4)$$

$$\cos(\alpha + \beta\cos\theta) = \sum_{p=-\infty}^{\infty} J_p(\beta)\cos(\alpha + P\theta + P\pi/2)$$

Expressions (3) and (4) are substituted for each other $$K \cdot f(t) \cdot f(t-t_o) = \quad (5)$$

$$\sum_{n=-\infty}^{\infty} J_n[2\beta\cos(\tfrac{1}{2}\omega_m t_o)]\cos[2\omega_c t - \omega_c t_o + n(\omega_m t - \tfrac{1}{2}\omega_m t_o)] + \sum_{p=-\infty}^{\infty} J_p[2\beta\sin(\tfrac{1}{2}\omega_m t_o)]\cos\left[\omega_c t_o + \frac{p\pi}{2} + p(\omega_m t - \tfrac{1}{2}\omega_m t_o)\right]$$

The coupled signal $f(t) \cdot f(t-t_o)$ produced as a result of piezo-electrical non-linearity as represented in expresion (5) is automatically determined by the spatial integration operation (dz) and varies in accordance with the length (L) of the output terminal.

The voltages of the output terminals are as follows:

$$K \cdot V_{op} = \int_0^L f(t-z/v) \cdot f(t-t_o-z/v)dz = \quad (6)$$

$$\int_0^L \left\{ \sum_{n=-\infty}^{\infty} J_n[2\beta\cos(\tfrac{1}{2}\omega_m t_o)]\cos[2\omega_c(t-z/v) - \omega_c t_o + J_n[\omega_m(t-z/v) - \tfrac{1}{2}\omega_m t_o] \right\} +$$

$$\sum_{p=-\infty}^{\infty} J_p[2\beta\sin(\tfrac{1}{2}\omega_m t_o)]\cos\left[ \omega_c t_o + \frac{p\pi}{2} + p\{\omega_m(t-z/v)\tfrac{1}{2}\omega_m t_o\} \right] dz =$$

$$\sum_{n=-\infty}^{\infty} \left[ \frac{\sin 2[\omega_c(t-z/v) - [\omega_c t_o + n[\omega_m(t-z/v) - \tfrac{1}{2}\omega_m t_o]}{-(2\omega_c + n\omega_m)\frac{1}{v}} \right]_0^L \times J_n[2\beta\cos(\tfrac{1}{2}\omega_m t_o)] +$$

$$\sum_{p=-\infty}^{\infty} \left[ \frac{\sin\{\omega_c t_o + \tfrac{1}{2}p\pi + P[\omega_m(t-z/v) - \tfrac{1}{2}\omega_m t_o]\}}{-p\omega_m \frac{1}{v}} \right]_0^L \times J_p[2\beta\sin(\tfrac{1}{2}\omega_m t_o)]$$

Expression (6) can be represented identically by a trigonometric function as follows:

$$K \cdot V_{op} = \sum_{n=-\infty}^{\infty} J_n[2\beta\cos(\tfrac{1}{2}\omega_m t_o)] \frac{\sin(-\omega_c L/v - \tfrac{1}{2}n\omega_m L/v)}{-(2\omega_c + n\omega_m)\frac{1}{v}} \times \quad (7)$$

$$\cos[2\omega_c t - \omega_c t_o + n(\omega_m t - \tfrac{1}{2}\omega_m t_o) - \omega_c L/v - \tfrac{1}{2}n\omega_m L/v] +$$

$$\sum_{p=-\infty}^{\infty} J_p \left[ 2\beta\sin(\tfrac{1}{2}\omega_m t_o) \frac{2\sin\left(-\tfrac{p}{2}\omega_m L/v\right)}{-p\omega_m \frac{1}{v}} \times \right.$$

$$\left. \cos\left[ \omega_c t_o + \frac{p\pi}{2} + P(\omega_m t - \tfrac{1}{2}\omega_m t_o) - \frac{p}{2}\omega_m L/v \right] \right]$$

if $\omega c <\!< 1$ for n, the following expression is produced $$\frac{\sin\tfrac{1}{2}(2\omega_c + n\omega_m)L/v}{\tfrac{1}{2}(2\omega_c + n\omega_m)L/v} \simeq 0 \quad (8)$$

if $p \leq 2$ for p, an approximate value, with the following expression is obtained $$\frac{\sin[\tfrac{1}{2}p\omega_m L/v]}{\tfrac{1}{2}P\omega_m L/v} \simeq 1 \quad (9)$$

$$K \cdot V_{op} \simeq L \sum_{P=-\infty}^{\infty} J_p[2\beta\sin(\tfrac{1}{2}\omega_m t_o)]\cos\left[ \omega_c t_o + \frac{p\pi}{2} + \right. \quad (10)$$

$$\left. p(\omega_m t - \tfrac{1}{2}\omega_m t_o) - \frac{p}{2}\omega_m L/v \right]$$

if $\tfrac{1}{2}\omega_m t_o <\!< b$, an approximate value, with the following expression is obtained.

$$2\beta \sin(\tfrac{1}{2}\omega_m t_o) \simeq \beta\omega_m t_o = \Delta\omega t_o \quad (11)$$

Therefore, if delay time $t_o$ is set to satisfy the condition $\Delta\omega t_o < 1$ and $\omega_m t_o <\!< 1$, the F.M. signals can be discriminated. On the other hand, the inter-digital transducers 61, 62 and 61', 62' are designed to determine both the center freqiuency and the width in accordance with the comb electrode width and the comb electrode mumber. For example The electrode width $\lambda$ $$\lambda = \frac{v}{f_o} \quad (12)$$

The distance between on edge of an electrode to the corresponding edge of the next electrode is determined by the expression (12) and the electrodes can be arranged in any pattern as long as the distance between them is equal v/f to. Accordingly, the band width $$BW = 2\frac{f}{N} \quad (13)$$

A broad band width from 10 MHz to 300 MHz can be processed by this invention.

In FIG. 4 and FIG. 5 the two inter-digital transducer 41, 41', 42, 42' and 51, 52, 52' act on the F.M. signal to produce signal dela time $t_o$. Thus, the delay time $t_o$ must meet the following conditions.
 (1) $\omega_m t_o <\!< 1$ in expression (10)
 (2) $\omega_m t_o \leq 1$ in expression (11)
 (3) $\Delta\omega t_o \leq 0.3$ for enhancing the discriminating sensitivity and discriminating linearity
 (4)

$$t_o = K\frac{\lambda}{4}$$

(K: constant) for synchronizing the phase of the two elastic surface waves. Therefore, said F.M. discriminator length, with the adjustment of the delay time as well as length of the output side, can be used as a DPSK (differential phase-shift keying) demodulator and applied to a digital communication system.

Figure 7:
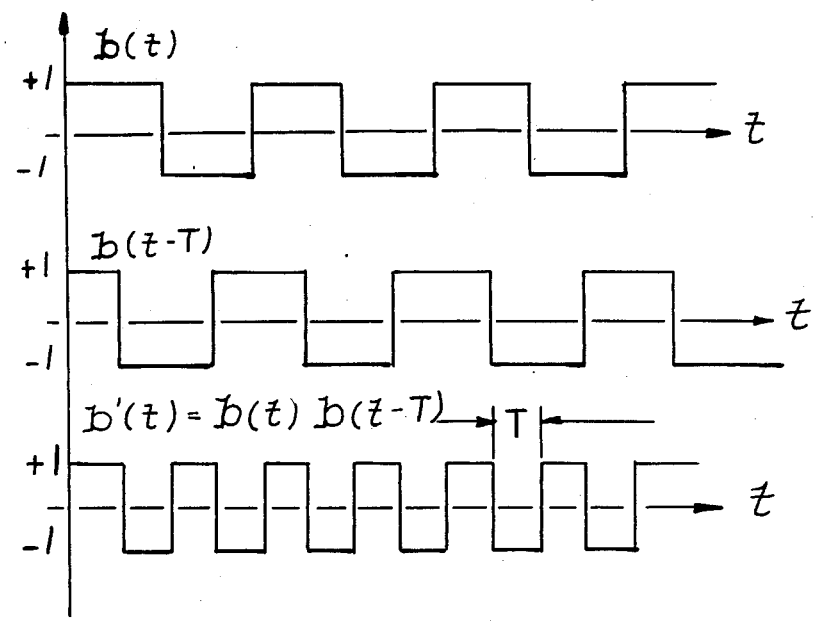
FIG. 7 is an illustration of a wave form produced by the DPSK demodulation operation of the F.M. signal discriminator.

Referring to FIG. 7, the SAW discriminator in accordance with this invention can perform the DPSK demodulation by setting the delay time of the two interdigital transducer elastic surface waves to a bit interval T of the DPSK signal. Then the output voltage ($e_o$) of the DPSK demodulator is:

$$e_o = K \int_0^L b(t - z/v) \cdot b(t - T - z/v)\cos\omega_o T \, dz \quad (14)$$

Expression (14) is equivalent to the following expression by the substitution of the expresion $u = t - z/v$ $$e_o = K \int_{t-L/v}^{t} b(u) \cdot b(u - T) \, du \quad (15)$$

If $L/v \ll T$,

Expression (15) is represented as follow;

$$e_o = K'b(t) = b(t-T) = K'b'(t) \quad (16)$$

As shown above, a DPSK signal can be produced by the DPSK demodulator in accordance with this invention.

Figure 8:
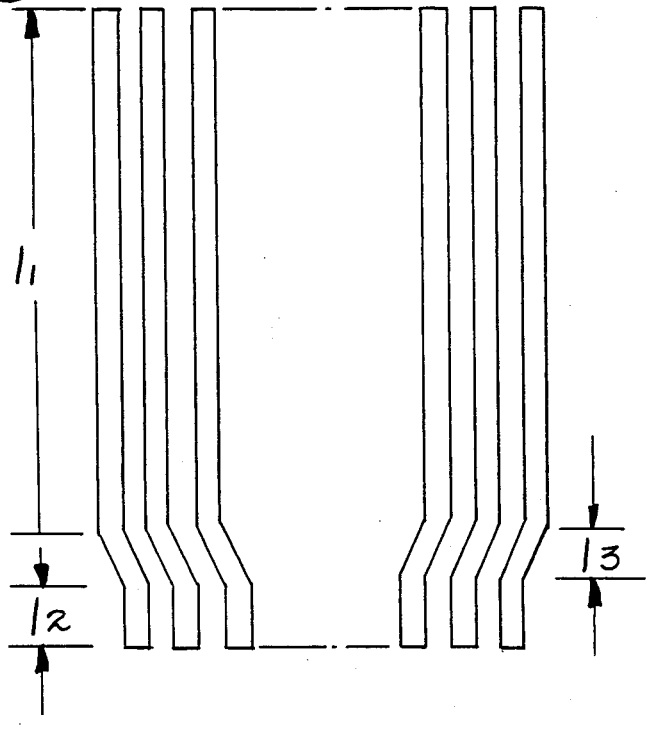
FIG. 8 is an illustration view showing the configuration of the multi-strip coupler of FIG. 4.

FIG. 8 shows a multi-strip coupler 43 of FIG. 4. The multi-strip coupler can filter low band frequencies by spatially integrating the electrical displacement of the elastic surface wave according to the electrode length ($l_1$, $l_2$, $l_3$) of the output side.

In accordance with this invention, an F.M. discriminator can be produced in the form of a small chip which requires no tuning and uses very little energy for operation. Also, production is simple because the photolithography method is employed.

Further, because this invention operates at high frequencies and can handle broad brand widths, an I.F. transducing portion is not required for F.M. receivers (88 MHz~108 MHz).

Also, this invention can be used as the DPSK demodulator if the delay time to is set to the bit interval T of the digital communication system and the length of the output terminal is adjusted.

Explaination of the code and characters used in above expressions f(t)=F.M signal
$\omega_c$=Carrier frequency
$\Delta\omega$=Modulation width
$\omega_m$=Modulation frequency
$\beta$=Modulation index $\left(\frac{\Delta\omega}{\omega_m}\right)$
to=Delay time
$J_n, J_p$=Bessel Function
?=Velocity of elastic surface wave
K.A.B.=Constant
L=Length of output terminal
$\lambda$=Wave length
$f_o$=Center frequency; of the interdigital transducer
$\beta\omega$=Band width of the interdigital transducer
N=Number of comb electrode pairs
$e_o$=Output voltage of DPSK demodulator
b(t)=DPSK data
T=Bit interval of DPSK data
$\omega_o$=Carrier frequency of DPSK data
z=complex displacement.

What is claimed is:

1. An elastic surface wave device formed on a piezo-electric substrate comprising:
   an interdigital transducer means for generating a predetermined time delay of a received signal, means for increasing the non-linearity of said signal in said piezo-electric substrate including a multi-strip coupler; and
   an output terminal means for filtering said signal.

2. An elastic surface wave device on a piezo-electric substrate comprising:
   an interdigital transducer means for generating a predetermined time delay of a received signal;
   means for increasing the non-linearity of said signal in said piezo-electric substrate including a hone type acoustic beam width compressor; and
   an output terminal means for filtering said delayed and compressed signal.

* * * * *